(12) United States Patent
Ulavi et al.

(10) Patent No.: US 10,910,243 B2
(45) Date of Patent: Feb. 2, 2021

(54) THERMAL MANAGEMENT SYSTEM

(71) Applicant: Applied Materials, Inc., Santa Clara, CA (US)

(72) Inventors: Tejas Ulavi, San Jose, CA (US); Dhritiman Subha Kashyap, Bangalore (IN); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/555,764

(22) Filed: Aug. 29, 2019

(65) Prior Publication Data
US 2020/0075366 A1 Mar. 5, 2020

Related U.S. Application Data

(60) Provisional application No. 62/726,177, filed on Aug. 31, 2018.

(51) Int. Cl.
| | |
|---|---|
| *H01L 21/67* | (2006.01) |
| *F28F 3/14* | (2006.01) |
| *F28F 27/02* | (2006.01) |
| *G01K 13/02* | (2006.01) |
| *G01K 7/02* | (2006.01) |

(52) U.S. Cl.
CPC .......... *H01L 21/67248* (2013.01); *F28F 3/14* (2013.01); *F28F 27/02* (2013.01); *F28F 2210/00* (2013.01); *F28F 2260/02* (2013.01); *G01K 7/021* (2013.01); *G01K 13/02* (2013.01)

(58) Field of Classification Search
CPC .......... H01L 21/67248; H05K 7/20263; H05K 7/20254; H05K 7/2089; H05K 7/20872; H05K 7/20927; C23C 16/4584
See application file for complete search history.

(56) References Cited

U.S. PATENT DOCUMENTS

| | | | |
|---|---|---|---|
| 5,275,237 A * | 1/1994 | Rolfson | F28F 3/12 165/168 |
| 8,274,017 B2 | 9/2012 | Yap et al. | |
| 9,353,441 B2 | 5/2016 | Chung et al. | |
| 9,888,528 B2 | 2/2018 | Matsushita et al. | |
| 10,062,587 B2 | 8/2018 | Chen et al. | |
| 2006/0231388 A1* | 10/2006 | Mullapudi | H01L 21/68785 204/298.01 |
| 2012/0074126 A1* | 3/2012 | Bang | H01L 21/68785 219/443.1 |

(Continued)

FOREIGN PATENT DOCUMENTS

| | | |
|---|---|---|
| JP | 4505169 B2 | 7/2010 |
| WO | 2015072661 A1 | 5/2015 |

OTHER PUBLICATIONS

PCT International Search Report and Written Opinion in PCT/US2019/048995 dated Jan. 13, 2020, 12 pages.

*Primary Examiner* — Mukundbhai G Patel
(74) *Attorney, Agent, or Firm* — Servilla Whitney LLC

(57) ABSTRACT

A thermal management system comprising a fluid channel with a plurality of parallel first flow paths extending along a first level in a first thermal mass and a plurality of parallel second flow paths extending along a second level in a second thermal mass are described. Methods for controlling the temperature of a substrate or heater surface and fluid manifolds are also described.

20 Claims, 8 Drawing Sheets

(56) References Cited

U.S. PATENT DOCUMENTS

2016/0056032 A1 2/2016 Baldasseroni
2016/0218028 A1 7/2016 Schaller et al.
2016/0230281 A1* 8/2016 Lin .................. H01J 37/32724

* cited by examiner

THERMAL MANAGEMENT SYSTEM

CROSS-REFERENCE TO RELATED APPLICATIONS

This application claims priority to U.S. Provisional Application No. 62/726,177, filed Aug. 31, 2018, the entire disclosure of which is hereby incorporated by reference herein.

TECHNICAL FIELD

Embodiments of the present disclosure generally relate to thermal management systems for substrate processing chambers. Some embodiments of the disclosure relate to thermal management systems which provide tight temperature control of multiple substrate processing regions in a single processing chamber.

BACKGROUND

Substrate processing methods often require that the substrate is maintained at an elevated temperature. The reactions used in many processing schemes can be temperature dependent, and as the scale of devices shrinks, sensitivity to variations in deposition or etch rates increases. For example, an ALD deposition process for SiN may require temperature variations of less than 0.5° C. across the surface of the substrate maintained at 450° C.

Also, processing throughput is a significant factor in the cost of producing a series of electronic devices. Manufacturers are seeking processes and equipment which can produce densely packed devices reliably and quickly. One innovation that has increased throughput is clustered processing chambers. The clustered chambers provide the unique ability to perform multiple processes on a substrate without breaking vacuum. Unfortunately, the time required to transfer substrates from one chamber to the next slows throughput. In response, processing chambers are now being developed which are capable of processing multiple substrates in multiple processing environments, all within the same chamber. The multiple processing environment processing systems have different issues related to heat loss and thermal uniformity.

Accordingly, there is a need for thermal management systems which provide tight temperature control of multiple substrates during processing.

SUMMARY

One or more embodiments of this disclosure relate to a thermal management system comprising a cooling channel having a first end and a second end. The first end is in fluid communication with a plurality of parallel first flow paths extending along a first level in a first thermal mass. The plurality of first flow paths are in fluid communication with a plurality of parallel second flow paths extending along a second level in a second thermal mass.

Additional embodiments of this disclosure relate to a method of controlling a substrate temperature. The method comprises flowing a coolant through a cooling channel having a first end and a second end. The first end is in fluid communication with a plurality of parallel first flow paths extending along a first level in a first thermal mass. The plurality of first flow paths are in fluid communication with a plurality of parallel second flow paths extending along a second level in a second thermal mass. Each second flow path surrounds a substrate.

Further embodiments of this disclosure relate to a cooling manifold. The cooling manifold comprises an inlet, at least one conduit, and an outlet. The inlet is configured to connect a heat exchanger with a plurality of parallel first flow paths extending along a first level. The at least one conduit is configured to connect the plurality of parallel first flow paths with a plurality of parallel second flow paths extending along a second level. The outlet is configured to connect the plurality of parallel second flow paths with the heat exchanger.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
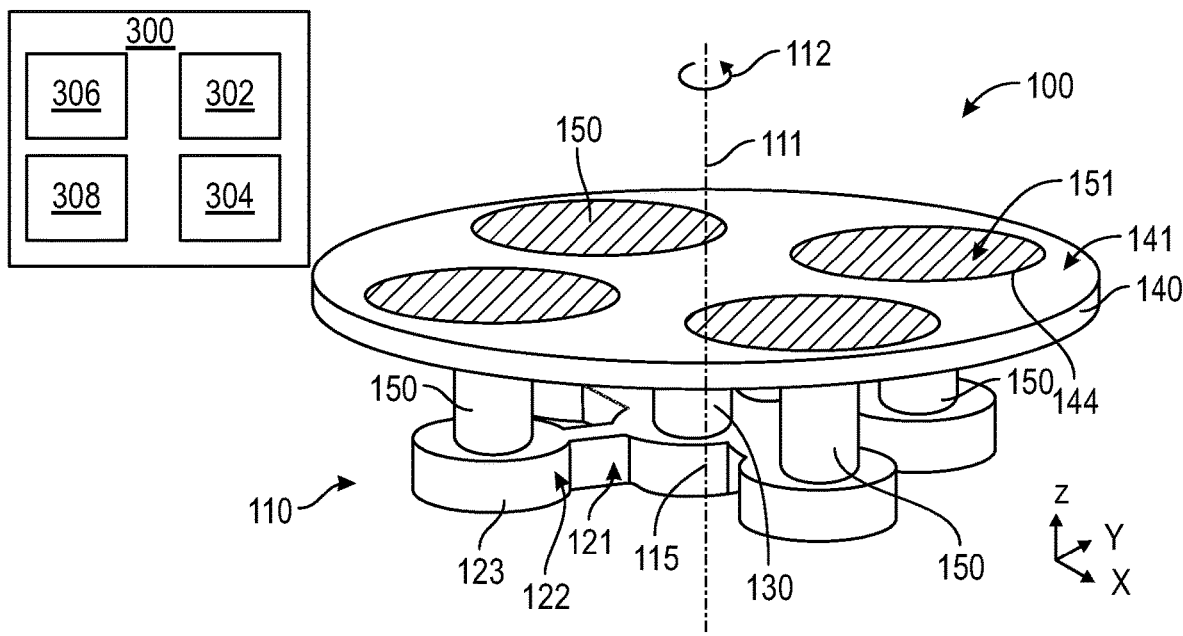
FIG. 1A shows a view of a support assembly according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to apparatus and methods for thermal management of a substrate processing region and/or pedestal heater/coolers to provide symmetric conductive and radiative boundary conditions. Exemplary embodiments of the disclosure provide distributed cooling loop designs for symmetric cooling of a substrate support assembly (also referred to as a spinner). Some embodiments of the disclosure advantageously provide for temperature variations across a substrate in a substrate processing region of less than or equal to about 0.5° C. Some embodiments of the disclosure advantageously provide a thermal management system to control multiple substrate processing regions. Some embodiments provide a uniform conductive and radiative heat transfer environment around heaters or coolers. Some embodiments provide a single heat exchanger cooling loop with efficient usage of space and energy. Some embodiments provide a thermal management system that is relatively easy to assembly and service.

Figure 1B:
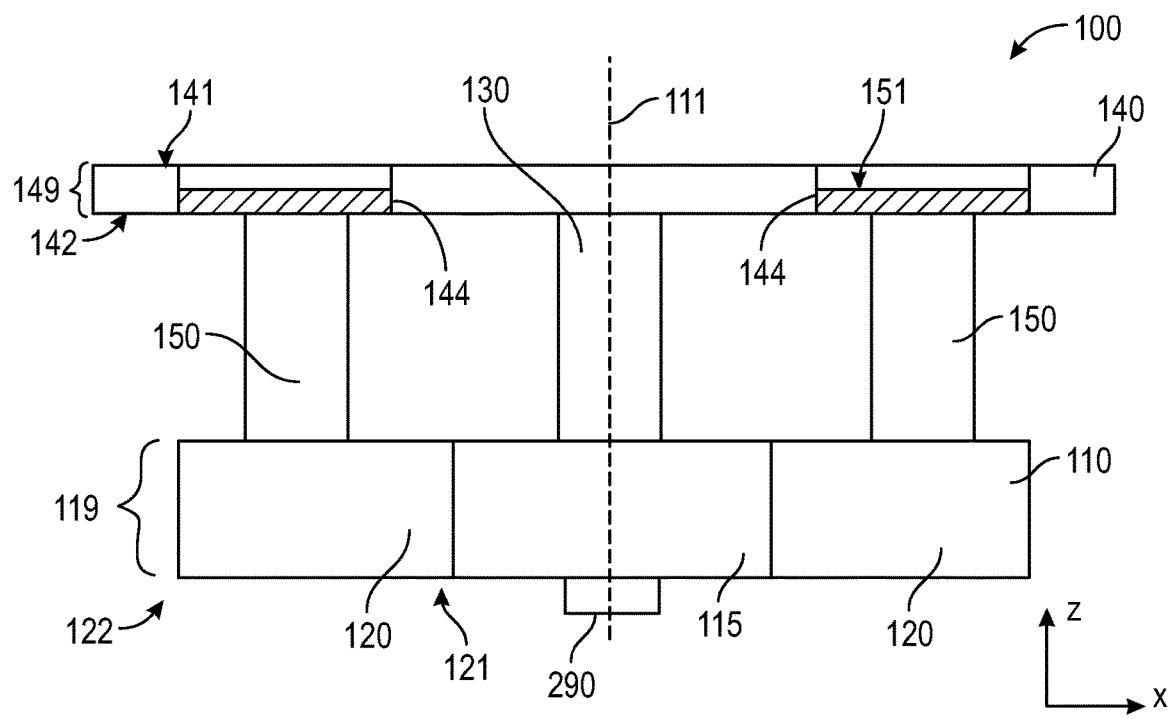
FIG. 1B shows a cross-sectional view of the support assembly of FIG. 1A.
Figure 2:
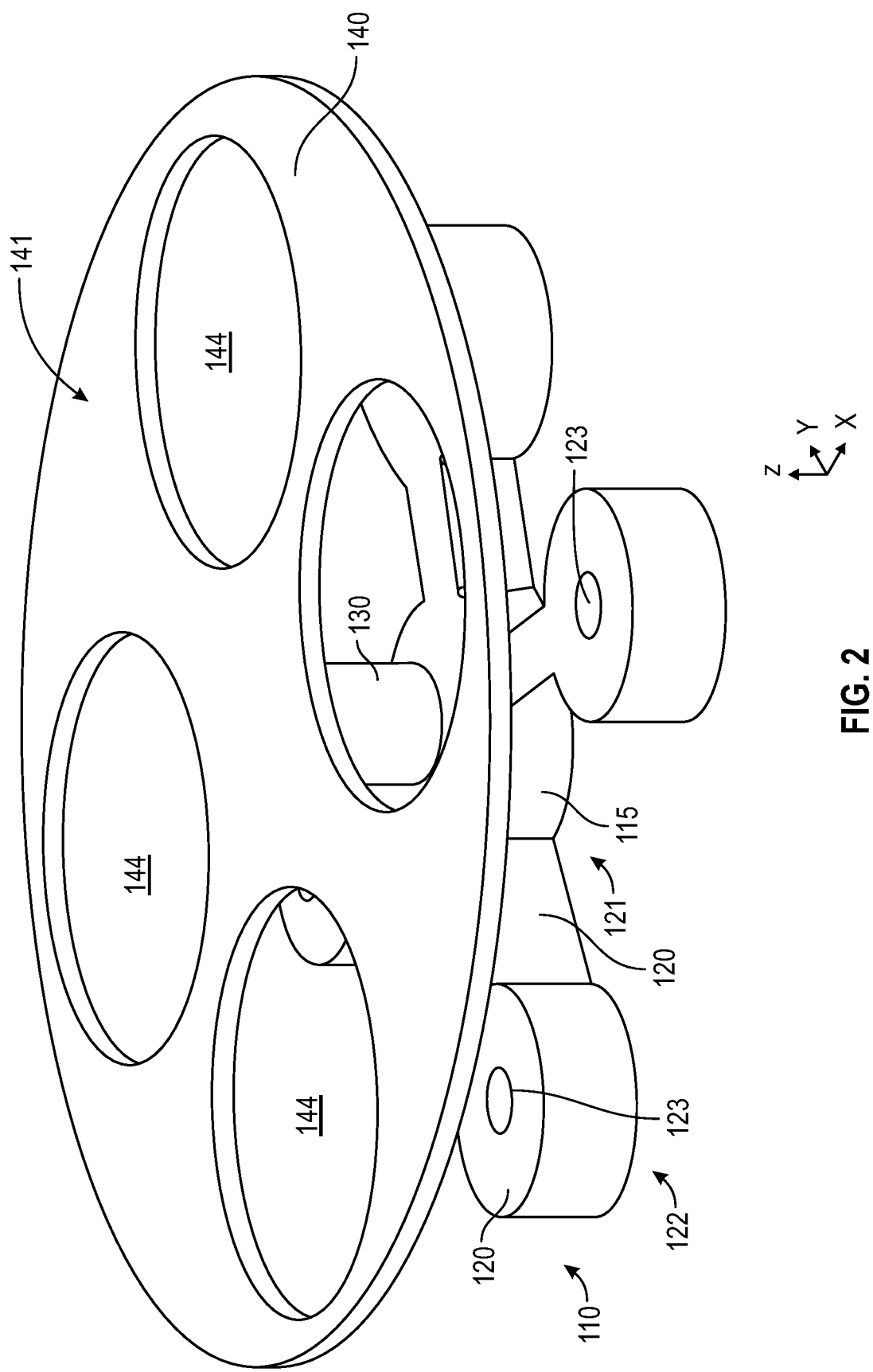
FIG. 2 shows a support assembly without heaters in accordance with one or more embodiment of the disclosure.

FIG. 1A illustrates a parallel projection view of a support assembly 100 according to some embodiments of the disclosure. FIG. 1B illustrates a cross-sectional side view of the substrate support assembly 100 of FIG. 1A. FIG. 2 shows a parallel projection view of a support assembly 100 without heaters.

The support assembly 100 includes a rotatable base 110, also referred to as a spinner. The rotatable base 110 can have a symmetrical or asymmetrical shape. In the illustrated embodiment, the rotatable base 110 has a generally cruciform shape with four support arms 120 extending from a center hub 115.

The rotatable base 110 rotates 112 around rotational axis 111 to move the support arms 120 along a circular or arcuate path. The rotational axis 111 extends in a first direction which is also referred to as the z-axis or vertical direction. The skilled artisan will recognize that the term "vertical" used in this manner is not limited to a direction normal to the pull of gravity.

In some embodiments, the support assembly 100 includes a plurality of support arms 120 connected to and extending from the center hub 115. The support arms 120 have an inner end 121 and an outer end 122. The inner end 121 is in contact with the center hub 115 so that when the center hub 115 rotates around the rotational axis 111, the support arms 120 rotate as well. The support arms 120 can be connected to the center hub 115 at the inner end 121 by fasteners (e.g., bolts, welds) or by being integrally formed with the center hub 115.

The number of support arms 120 in the support assembly 100 can vary. In some embodiments, there are at least two support arms 120. In some embodiments, there are three support arms 120. In some embodiments, as shown in the Figures, there are four support arms 120. In some embodiments, there are five support arms 120. In some embodiments, there are six support arms 120.

The support arms 120 can be arranged symmetrically around the center hub 115. For example, in a support assembly 100 with four support arms 120, each of the support arms 120 are positioned at 90° intervals around the center hub 115. In a support assembly 100 with three support arms 120, the support arms 120 are positioned at 120° intervals around the center hub 115.

The center hub 115 is connected to or is a part of support post 130. The support post 130 can be connected to the center hub 115 by any suitable fastener (e.g., bolts, welds) or can be integrally formed with the center hub 115. The support post 130 extends along the rotational axis 111 by a length. The length of the support post 130 separates the rotatable base 110 from a top plate 140.

The top plate 140 has a top surface 141 and bottom surface 142 defining a thickness of the top plate 140. The top plate 140 can have a plurality of openings 144 which can provide regions for a substrate to be supported on a separate component or on a recess (not shown) formed in the top surface 141 of the top plate 140.

In some embodiments, the top plate 140 is attached to the support post 130 by any suitable fastener (e.g., bolts, welds). The top plate 140 can be fixed to the support post 130 so that the top plate 140 moves vertically (along the z-axis) and rotates around rotational axis 111 with support assembly 100.

In some embodiments, a heater 150 is positioned at the outer end 122 of the support arms 120. In some embodiments, each support arm 120 has a heater 150. The heater 150 has a support surface 151 which can support a substrate for processing.

As shown in FIG. 2, the heater 150 can be positioned on a heater base 123 located at the outer end 122 of the support arms 120. The heater base 123 can include connections to power a heater 150, suitable wiring to measure temperature, or other components. The center of the heater bases 123 are located at a distance from the rotational axis 111 so that upon rotation 112 of the center hub 115 the heater bases 123 move in a circular path. When a heater 150 is positioned on the heater base 123, the heater 150 moves with the rotation 112 of the support assembly 100.

The heaters 150 can be any suitable type of heater known to the skilled artisan. In some embodiments, the heater is a resistive heater with one or more heating elements within a heater body.

The substrate can be held on the support surface 151 by gravity, electrostatic chucking or other suitable technique. The heaters of some embodiments include additional components. For example, the heaters may comprise an electrostatic chuck. The electrostatic chuck can include various wires and electrodes so that a wafer positioned on the heater support surface can be held in place while the heater is moved. This allows a wafer to be chucked onto a heater at the beginning of a process and remain in that same position on that same heater while moving to different process regions.

As shown in FIG. 1A, the top plate 140 can include one or more openings 144 which can be positioned around the heaters 150 to help provide a seal or barrier to minimize gas flowing to a region below the top plate 140. In some embodiments, the top plate 140 is located below the support surface 151 so that the top surface 141 of the top plate 140 is below the support surface 151 of the heater 150. In some embodiments, the top plate 140 surrounds all of the heaters with a plurality of openings 144 to allow access to the support surface 151 of the heaters 150. The openings 144 can allow the heaters 150 or support surfaces 151 to pass through the top plate 140.

In some embodiments, the top plate 140 has a top surface 141 forming a major plane that is substantially parallel with a major plane formed by the support surface 151 of the heaters 150. In some embodiments, the top plate 140 has a top surface 141 forming a major plane that is a distance above the major plane of the support surface 151 of the heaters 150 by an amount substantially equal to the thickness of a wafer to be processed so that the wafer surface is substantially coplanar with the top surface 141 of the top plate 140. As used in this manner, the term "substantially coplanar" means that the planes formed by the individual support surfaces are within ±5°, ±4°, ±3°, ±2° or ±1° of the planes formed by the other support surfaces.

Referring to FIG. 1B, the support assembly 100 can be broken down into different thermal masses. Even in an integrally formed system, the thermal masses can be considered separate due to the volume and heat capacity of the support assembly 100 components. The first thermal mass 119 is located at the level of the rotatable base 110 and a second thermal mass 149 is located at the level of the top plate 140.

Figure 3:
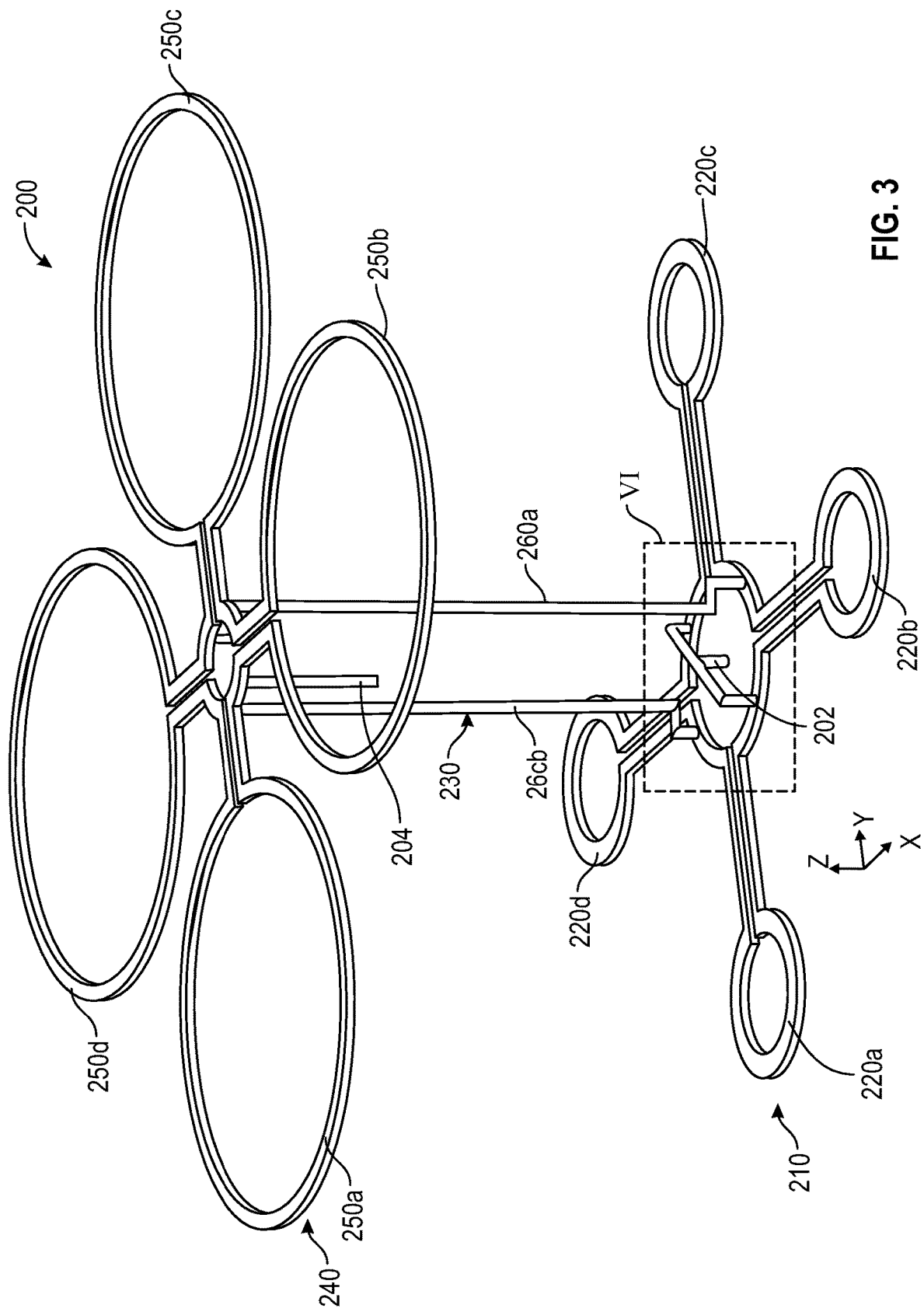
FIG. 3 shows a cooling channel according to some embodiments of the disclosure.

FIG. 3 illustrates a fluid channel 200 for use with the thermal management system. The fluid channel 200 illustrated can be formed within the support assembly 100 so that the various flow paths are configured to flow through the support arms 120, support post 130 and top plate 140. As discussed herein, the thermal management system of some embodiments may also comprise additional elements or components not shown in FIG. 3. The fluid channel 200 may also be referred to as a cooling channel or heating channel. The skilled artisan will recognize that a description of a cooling channel can also refer to a heating channel, or more generically to a fluid channel.

In some embodiments, the fluid channel 200 has a first end 202 and a second end 204. The fluid channel 200 can be a single integrally formed or welded component or can be several different components connected with suitable fluid-tight seals. The embodiment illustrated in FIG. 3 is a single integrally formed component with three regions: a rotatable base portion (first level 210); a support post portion 230 and a top plate portion (second level 240). The rotatable base portion (first level 210) is located primarily within the rotatable base 110. The support post portion 230 is located primarily within the support post 130. The top plate portion (second level 240) is located primarily within the top plate 140. In embodiments without a top plate 140, the top plate portion (second level 240) can be omitted or can be within a surface associated with the heater 150.

In some embodiments, the first end 202 is in fluid communication with a plurality of first flow paths 220a, 220b, 220c, 220d. As used in this specification, terms for similar components with individual lettered reference numerals (e.g., 220a, 220b) can be commonly referred to using the reference numeral without the appended letter. For example, first flow paths 220 refer to all of flow paths 220a, 220b, 220c, 220d. While four first flow paths 220 are illustrated in FIG. 3, the skilled artisan will understand that there may be any number of first flow paths.

In some embodiments, the first flow paths 220a, 220b, 220c, 220d are arranged in parallel. As used in this regard, "parallel" means that the flow paths branch out from or reconnect to a single point. "Parallel" flow paths should be understood as being different from serial flow paths. Stated differently, fluid flows through each flow path of the first flow paths 220 at the same time, through each flow path of the second flow paths 250 at the same time, and between the first flow paths 220 and second flow paths 250 sequentially, as described further below. Accordingly, "parallel" should be understood in the context of electronics (e.g., parallel resistors), rather than geometry (e.g., parallel lines).

In some embodiments, each first flow path 220a, 220b, 220c, 220d has similar conductance. As used in this regard, "conductance" refers to the volume of flow or flow rate that an individual flow path is capable of handling. Conductance can be considered to be a measure of flow efficiency through the flow paths.

Figure 4:
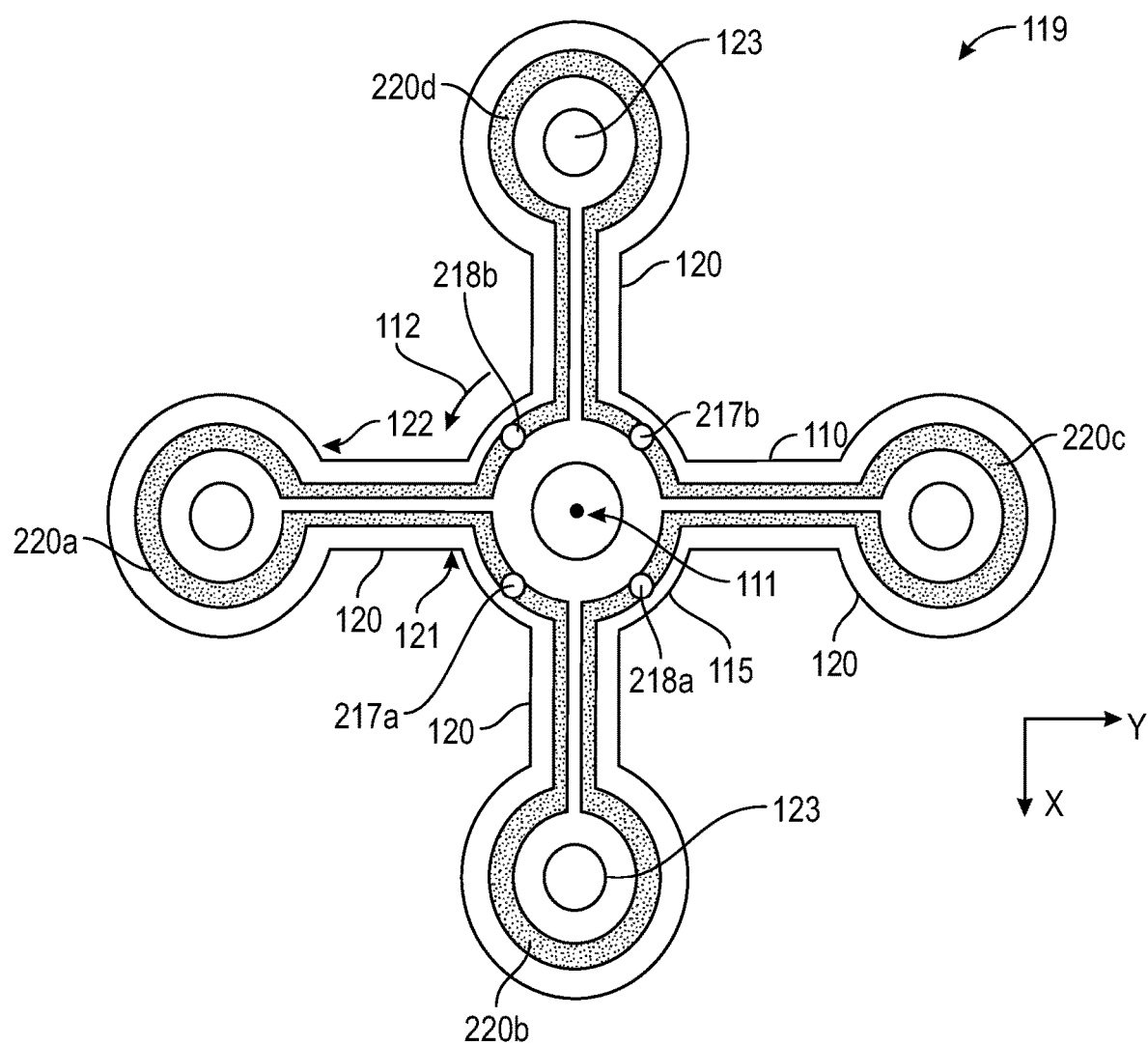
FIG. 4 shows an schematic top view of a first thermal mass of a substrate support assembly according to some embodiments of the disclosure.

In some embodiments, the plurality of first flow paths 220a-220d extends along the first level in a first thermal mass 119. The first thermal mass 119 is not shown in FIG. 3. FIG. 4 illustrates a top view of an exemplary first thermal mass 119. Referring to FIG. 4, the first end 202 of the fluid channel 200 is in fluid communication with at least one inlet junction 217. The illustrated embodiment has two inlet junctions 217a, 217b. The skilled artisan will recognize that there can by any suitable number of inlet junctions 217 depending on the number of support arms 120 and shape of the first flow paths 220. The inlet junctions 217a, 217b are in fluid communication with the plurality of first flow paths 220a-220d extending along the first level in the first thermal mass 119.

In the illustrated embodiment, each of the first flow paths 220 extends from an inlet junction 217, through an support arm 120 around heater base 123 to an outlet junction 218. The embodiment shown has two outlet junctions 218a, 218b arranged so that each first flow path 220 extends from an inlet junction 217 through one support arm 120 to an outlet junction. In the arrangement shown, there are two first flow paths 220 connected to each of the inlet junctions 217 and to each of the outlet junctions 218.

Figure 5:
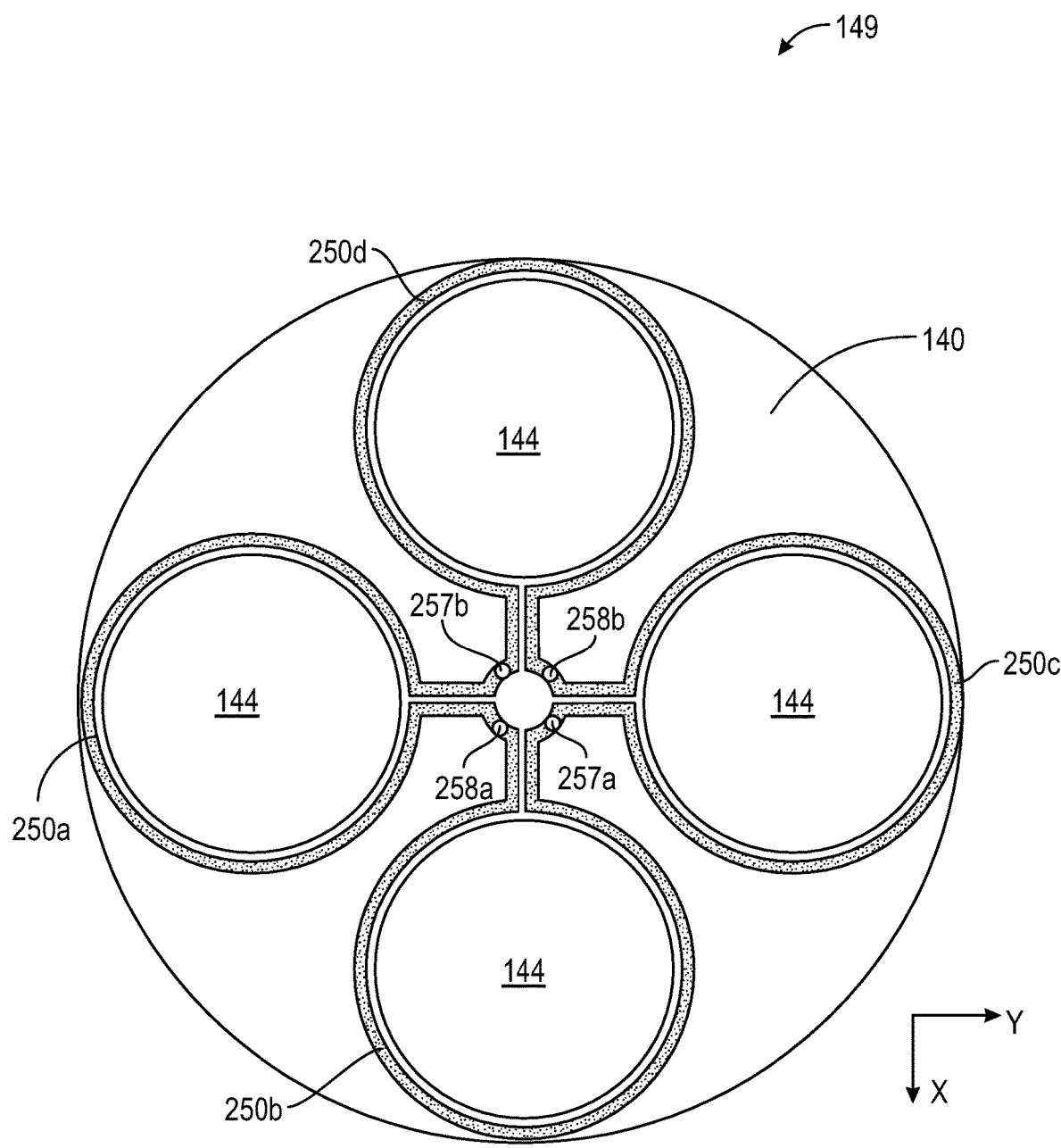
FIG. 5 shows an schematic top view of a second thermal mass of a substrate support assembly according to some embodiments of the disclosure.

Referring again to FIG. 3, in some embodiments the first flow paths 220 are in fluid communication with a plurality of second flow paths 250 through conduits 260. The conduits 260 extend along the length of the support post 130 to allow flow between the first thermal mass 119 and the second thermal mass 149. In some embodiments, as shown in FIGS. 3-5, the plurality of first flow paths 220 and the plurality of second flow paths 250 each comprise four flow paths. In some embodiments, the second thermal mass 149 comprises a top plate 140.

Referring to FIGS. 3 and 5, the plurality of second flow paths 250a-250d extends along a second level 240 of the second thermal mass 149. The second thermal mass 149 is illustrated in FIG. 1B and as a top view in FIG. 5. The conduits 260a, 260b are in fluid communication with inlet junctions 257a, 257b and the plurality of second flow paths 250a-250d extending along second level 240. The illustrated embodiment has two inlet junctions 257a, 257b. The skilled artisan will recognize that there can by any suitable number of inlet junctions 257 depending on the shape of the second flow paths 250 and the second thermal mass 149. The inlet junctions 257a, 257b are in fluid communication with the plurality of second flow paths 250a-250d extending along the second level 240 in the second thermal mass 149.

In the illustrated embodiment, each of the second flow paths 250 extends from an inlet junction 257, around opening 144 to an outlet junction 258. The embodiment shown has two outlet junctions 258a, 258b arranged so that each second flow path 250 extends from an inlet junction 257 around one opening 144 in top plate 140 to an outlet junction 258. In the arrangement shown, there are two second flow paths 250 connected to each of the inlet junctions 257 and to each of the outlet junctions 258.

Figure 6:
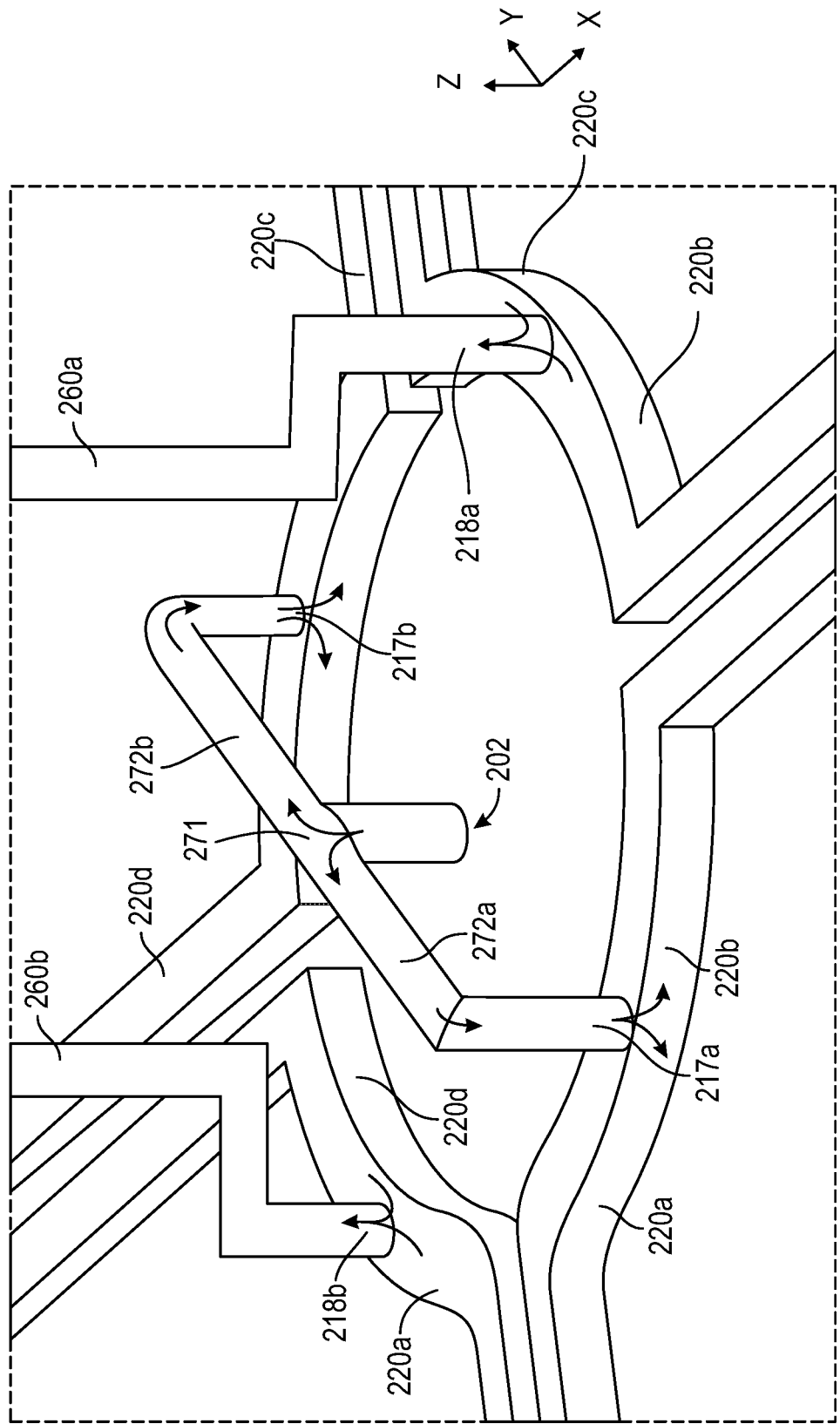
FIG. 6 shows an enlarged view of region VI of FIG. 3.

The flow through the fluid channel 200 is described with reference to FIGS. 3 through 6. (FIG. 6 shows an expanded view of region VI of FIG. 3.) A fluid flows in first end 202 and splits at junction 271 into two flow paths 272a, 272b. Fluid flowing through flow path 272a enters the first level 210 at inlet junction 217a and splits into first flow path 220a and first flow path 220b. Fluid flowing through path 272b enters the first level 210 at inlet junction 217b and splits into first flow path 220c and first flow path 220d.

Each of the first flow paths 220a-220d flow through the first level 210 to outlet junctions 218a, 218b. The flow through first flow path 220a is in fluid communication with outlet junction 218b. The flow through first flow path 220b is in fluid communication with outlet junction 218a. The flow through first flow path 220c is in fluid communication with outlet junction 218a. The flow through first flow path 220d is in fluid communication with outlet junction 218b. Thus the flow splits at junctions 271a and 271b are intermixed upon joining at outlet junctions 218a and 218b.

Fluid flows from outlet junction 218a through conduit 260a to junction 257a at the second level 240. Fluid flowing from outlet junction 218b goes through conduit 260b to junction 257b of the second level 240. The fluid in conduit 260a splits at inlet junction 257a into second flow path 250b and 250c. The fluid in conduit 260b splits at inlet junction 257b into second flow path 250d and 250a.

As shown in FIG. 5, the second flow paths 250 can extend around the openings 144 in the top plate 140 and exit the second level 240 through outlet junctions 258a, 258b. The fluid flowing through second flow path 250a and second flow path 250b combine at outlet junction 258a. The fluid flowing through second flow path 250c and second flow path 250d combine at outlet junction 258b. The fluid flows from outlet junctions 258a and 258b can be combined at another junction (not shown) to flow out of the second end 204 of the fluid channel 200.

In some embodiments, the number of conduits 260 is less than the number of first flow paths 220 and less than the number of second flow paths 250. In this regard, the first flow paths 220 and the second flow paths 250 do not relate in a direct one to one relationship. Stated differently, in some embodiments, at least two of the first flow paths 220 merge before connecting with the second flow paths 250. In some embodiments, as illustrated, the plurality of first flow paths 220 and the plurality of second flow paths 250 each comprise four flow paths and the number of conduits 260 is two. In some embodiments, the first flow paths 220 combine to one conduit 260 to flow between first level 210 and second level 240.

The conduits 260 of some embodiments are generally straight, as illustrated. In some embodiments, the conduits 260 extend substantially perpendicular to a plane formed by the first flow paths and/or the second flow paths. As used in this manner, the term "substantially perpendicular" means that the angle of the conduit is within ±30°, ±20°, ±10° or ±5° of 90°. In some embodiments, the conduits 260 follow a curved path between the first flow paths and second flow paths.

Figure 7:
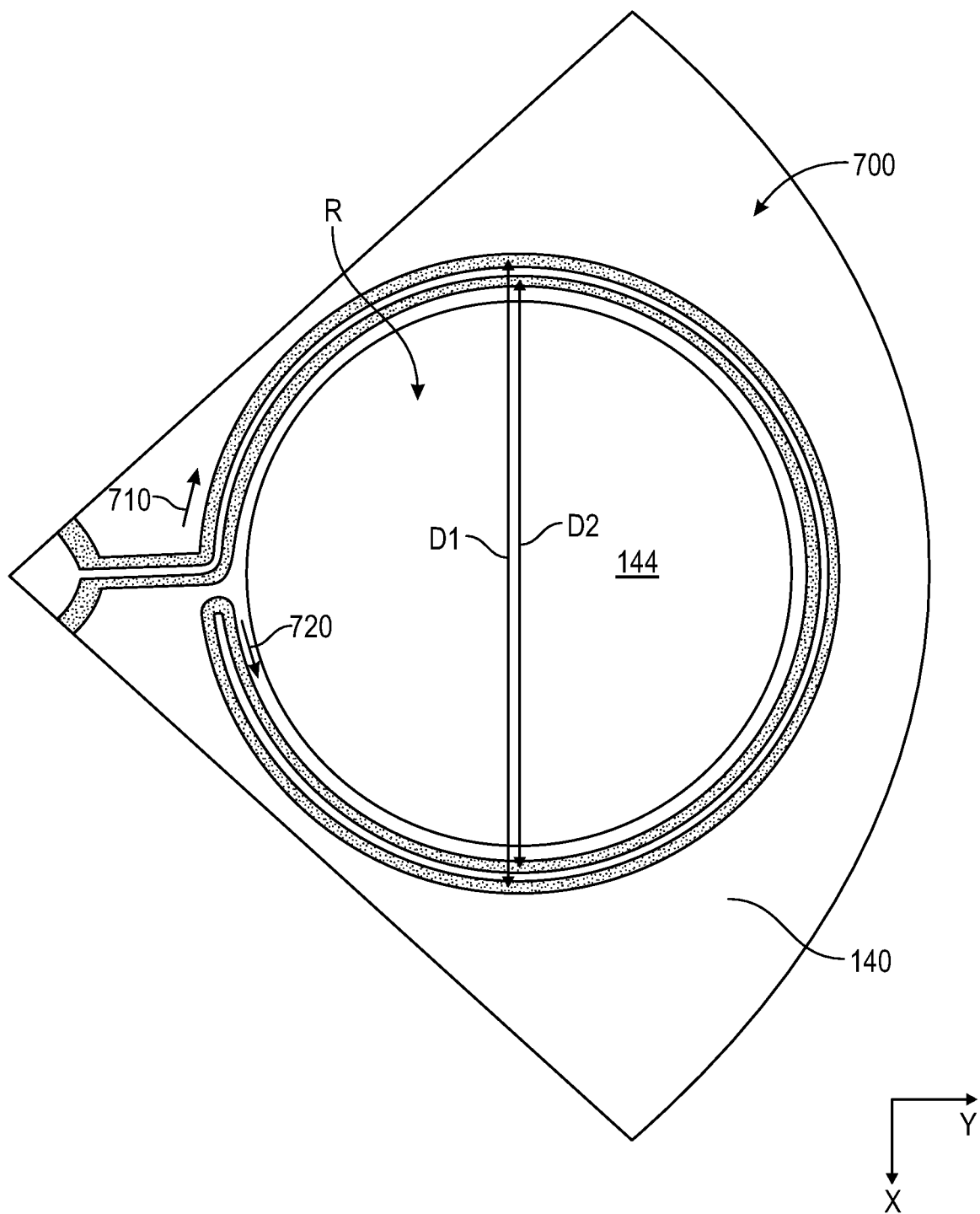
FIG. 7 shows a partial schematic top view of a thermal mass using a counter flow loop according to some embodiments of the disclosure.

FIG. 7 shows another embodiment in which the flow path is arranged in a counter-flow loop arrangement. As used in this regard, a counter-flow loop passes through a region twice, once in each direction, to provide better thermal control. FIG. 7 shows a portion of a top plate 140 with second level 240 flow around one opening 144 according to one or more embodiment. The illustrated configuration provides for fluid (e.g., coolant) to flow into a loop 700 in a first direction 710 to surround a region R (in this case opening 144) through a path at a diameter D1. Once the region has been encircled (or nearly encircled), the path returns around the region R in the opposite direction 720 at a diameter D2. In some embodiments, the diameter D1 is greater than the diameter D2. In some embodiments, the diameter D1 is smaller than the diameter D2. In some embodiments, the two paths (clockwise and counter clockwise) are concentric.

In some embodiments, the first end 202 and the second end 204 are fluidly connected to form a cooling loop. In some embodiments, the first end 202 and the second end 204 are fluidly connected to a heat exchanger 290 (shown in FIG. 1B). The heat exchanger 290 may be any suitable component that is configured or arranged to control the temperature of a fluid (e.g., coolant) in the fluid channel 200.

In some embodiments, the fluid channel contains a coolant (i.e., acts as a cooling channel). The coolant may be any suitable coolant, including but not limited to, glycol (e.g., ethylene glycol), deionized water, a perfluorinated polyether (such as Galden®, available from Solvay S. A.), or solutions or combinations thereof.

In some embodiments, the thermal management system further comprises at least one controller 300. In some embodiments, the at least one controller 300 is coupled to one or more of the heat exchanger 290, any valves or plenums along the fluid channel, pumps, etc. The controller 300 may be one of any form of general-purpose computer processor, microcontroller, microprocessor, etc., that can be used in an industrial setting for controlling various chambers and sub-processors.

The at least one controller 300 can have a processor 302, a memory 304 coupled to the processor 302, input/output devices 306 coupled to the processor 302, and support circuits 308 to communication between the different electronic components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor that is remotely located from the hardware being controlled by the processor. Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware.

The software routine, when executed by the processor, transforms the general purpose computer into a specific purpose computer (controller) that controls the operation of the thermal management system such that the processes and methods are performed.

In some embodiments, the controller 300 has one or more configurations to execute individual processes or sub-processes. The controller 300 can be connected to and configured to operate intermediate components to perform the functions of the processes and methods. For example, the controller can be connected to and configured to control one or more of valves, actuators, motors, pumps, etc.

The controller 300 of some embodiments has one or more configurations selected from: a configuration to pump or flow a fluid (e.g., coolant) through the fluid channel; a configuration to measure the temperature of the fluid; a configuration to measure the temperature variation of a substrate processing region; a configuration to measure the temperature of the heater surface; and a configuration to control the operation of the heat exchanger.

Figure 8:
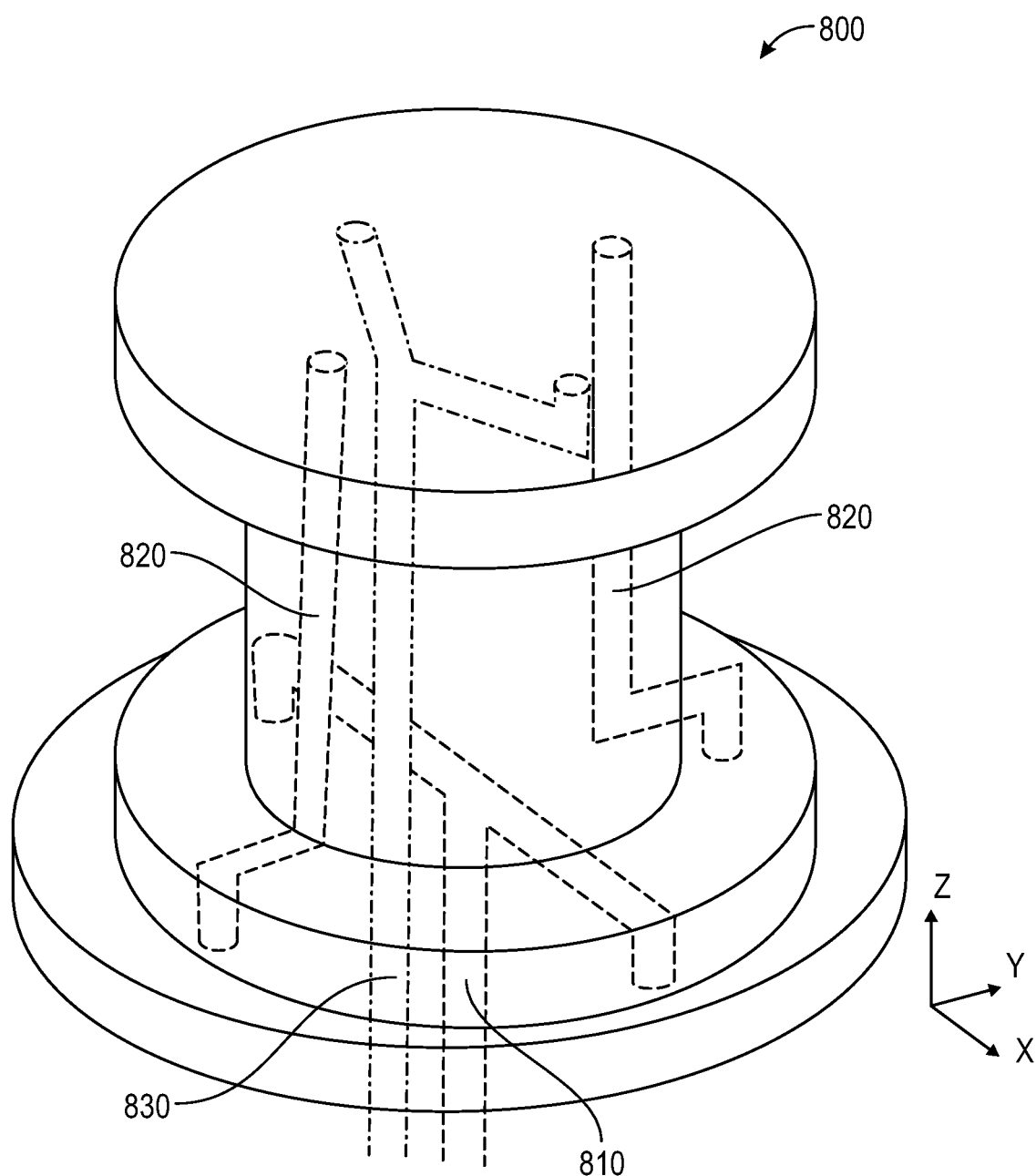
FIG. 8 shows an isometric view of a fluid distribution manifold illustrating internal structure according to some embodiments of the disclosure.

Additional embodiments of the disclosure, as shown in FIG. 8, are directed to fluid manifolds 800. Some embodiments of the disclosure relate to a cooling manifold (that is a fluid manifold 800 that a coolant is flowed through). In some embodiments, the fluid manifold 800 is part of support post 130 or center hub 115. In the illustrated embodiment, the fluid manifold 800 comprises an inlet 810, at least one conduit 820 and an outlet 830. In some embodiments, the fluid manifold 800 may be the support post 130 or contained within the support post 130.

In some embodiments, the inlet 810 is configured to connect a heat exchanger 290 with a plurality of parallel first flow paths 220 extending along a first level 210. In some embodiments, the at least one conduit 820 is configured to connect the plurality of parallel first flow paths 220 with a plurality of parallel second flow paths 250 extending along a second level 240. In some embodiments, the outlet 830 is configured to connect the plurality of parallel second flow paths 250 with the heat exchanger 290.

Some embodiments of the disclosure relate to methods of controlling the temperature of a heater support surface or a substrate. Some embodiments advantageously provide temperature control of the substrate such that temperature variations across the substrate are minimized. In some embodiments, the methods control the substrate (or heater support surface) temperature within a range (difference between minimum and maximum temperature) of less than or equal to about 0.5° C., less than or equal to about 0.4° C., less than or equal to about 0.3° C., less than or equal to about 0.2° C., or less than or equal to about 0.15° C.

In some embodiments, the temperature variations of the substrate or heater support surface are measured at an elevated temperature. In some embodiments, the temperature variations of the substrate are measured at substrate (or surface) temperatures greater than or equal to about 400° C., greater than or equal to about 450° C., greater than or equal to about 500° C., or greater than or equal to about 550° C. In some embodiments, the temperature variations of the substrate (or support surface) are measured at substrate temperatures of about 400° C., about 450° C., about 500° C., about 525° C., about 550° C., about 575° C., or about 600° C.

In some embodiments, the methods provide for maintaining the first thermal mass and the second thermal mass at a temperature close to the temperature of the coolant at the first end. As used in this regard, a temperature is close to another temperature if it is within ±20° C., ±10° C., ±5° C., ±2° C., ±1° C., or ±0.5° C.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A thermal management system comprising a fluid channel having a first end and a second end, the first end in fluid communication with a plurality of parallel first flow paths extending along a first level in a first thermal mass, the plurality of first flow paths in fluid communication with a plurality of parallel second flow paths extending along a second level in a second thermal mass, wherein the plurality of first flow paths comprise an equal number of flow paths as the plurality of second flow paths, and the plurality of first flow paths and the plurality of second flow paths each comprise four flow paths.

2. The thermal management system of claim 1, wherein the first end and the second end are fluidly connected to a heat exchanger.

3. The thermal management system of claim 1, wherein the first thermal mass comprises a support assembly and each of the first flow paths surrounds a heater base.

4. The thermal management system of claim 1, wherein the second thermal mass comprises a top plate and each of the second flow paths surrounds a substrate processing region.

5. The thermal management system of claim 1, wherein each of the first flow paths and second flow paths is arranged in a counter-flow arrangement.

6. The thermal management system of claim 1, wherein the plurality of first flow paths and the plurality of second flow paths are connected through a number of conduits less than the plurality of first flow paths and less than the plurality of second flow paths.

7. The thermal management system of claim 6, wherein the plurality of first flow paths and the plurality of second flow paths each comprise four flow paths and the number of conduits is two.

8. The thermal management system of claim 1, further comprising a coolant within the fluid channel comprising glycol.

9. The thermal management system of claim 1, wherein the first end and the second end are fluidly connected to a heat exchanger, the second thermal mass comprises a top plate and each of the second flow paths surrounds a substrate processing region, and further comprising a coolant within the fluid channel.

10. The thermal management system of claim 9, further comprising a controller configured to control a flow of the coolant through the fluid channel and configured to control the heat exchanger to maintain a predetermined temperature of the coolant.

11. A thermal management system comprising a fluid channel having a first end and a second end, the first end in fluid communication with a plurality of parallel first flow paths extending along a first level in a first thermal mass, the plurality of first flow paths in fluid communication with a plurality of parallel second flow paths extending along a second level in a second thermal mass, wherein the plurality of first flow paths and the plurality of second flow paths are connected through a number of conduits less than the plurality of first flow paths and less than the plurality of second flow paths.

12. The thermal management system of claim 11, wherein the first end and the second end are fluidly connected to a heat exchanger.

13. The thermal management system of claim 11, wherein the first thermal mass comprises a support assembly and each of the first flow paths surrounds a heater base.

14. The thermal management system of claim 11, wherein the second thermal mass comprises a top plate and each of the second flow paths surrounds a substrate processing region.

15. The thermal management system of claim 11, wherein each of the first flow paths and second flow paths is arranged in a counter-flow arrangement.

16. The thermal management system of claim 11, wherein the plurality of first flow paths comprises an equal number of flow paths as the plurality of second flow paths.

17. The thermal management system of claim 16, wherein the plurality of first flow paths and the plurality of second flow paths each comprise four flow paths.

18. The thermal management system of claim 11, wherein the plurality of first flow paths and the plurality of second flow paths each comprise four flow paths and the number of conduits is two.

19. The thermal management system of claim 11, further comprising a coolant within the fluid channel comprising glycol.

20. The thermal management system of claim 11, wherein the first end and the second end are fluidly connected to a heat exchanger, the second thermal mass comprises a top plate and each of the second flow paths surrounds a substrate processing region, and further comprising a coolant within the fluid channel.

* * * * *